United States Patent
Huang et al.

(10) Patent No.: US 8,916,889 B2
(45) Date of Patent: Dec. 23, 2014

(54) LIGHT EMITTING DEVICE

(71) Applicants: Jing-En Huang, Tainan (TW); Yi-Ru Huang, Tainan (TW); Chih-Ling Wu, Tainan (TW); Yu-Yun Lo, Tainan (TW)

(72) Inventors: Jing-En Huang, Tainan (TW); Yi-Ru Huang, Tainan (TW); Chih-Ling Wu, Tainan (TW); Yu-Yun Lo, Tainan (TW)

(73) Assignee: Genesis Photonics Inc., Tainan (TW)

( * ) Notice: Subject to any disclaimer, the term of this patent is extended or adjusted under 35 U.S.C. 154(b) by 55 days.

(21) Appl. No.: 13/831,965

(22) Filed: Mar. 15, 2013

(65) Prior Publication Data

US 2014/0167080 A1 Jun. 19, 2014

(30) Foreign Application Priority Data

Dec. 18, 2012 (TW) .............................. 101148146 A

(51) Int. Cl.
  *H01L 27/15* (2006.01)
  *H01L 33/36* (2010.01)
  *H01L 33/10* (2010.01)
  *H01L 33/40* (2010.01)
  *H01L 33/44* (2010.01)
  *H01L 33/46* (2010.01)
  *H01L 33/20* (2010.01)
  *H01L 33/62* (2010.01)

(52) U.S. Cl.
  CPC .............. *H01L 27/153* (2013.01); *H01L 33/36* (2013.01); *H01L 33/10* (2013.01); *H01L 33/40* (2013.01); *H01L 33/44* (2013.01); *H01L 33/46* (2013.01); *H01L 33/20* (2013.01); *H01L 33/405* (2013.01); *H01L 33/62* (2013.01)
  USPC .................................. 257/93; 257/88; 257/91

(58) Field of Classification Search
  CPC ......... H01L 33/10; H01L 33/20; H01L 33/36; H01L 33/44; H01L 33/46; H01L 33/405
  USPC ............................................... 257/88, 91, 93
  See application file for complete search history.

(56) References Cited

U.S. PATENT DOCUMENTS

| | | | | |
|---|---|---|---|---|
| 2010/0163887 A1* | 7/2010 | Kim et al. | ....................... | 257/76 |
| 2010/0163907 A1* | 7/2010 | Hsu et al. | ....................... | 257/98 |
| 2011/0210311 A1* | 9/2011 | Kim et al. | ....................... | 257/13 |
| 2012/0056212 A1* | 3/2012 | Huang et al. | ................... | 257/88 |
| 2012/0146066 A1* | 6/2012 | Tischler et al. | ................. | 257/89 |
| 2012/0292646 A1* | 11/2012 | Nagai | ............................. | 257/88 |
| 2013/0032815 A1* | 2/2013 | Hung et al. | .................... | 257/76 |

* cited by examiner

*Primary Examiner* — Peniel M Gumedzoe
(74) *Attorney, Agent, or Firm* — Jianq Chyun IP Office

(57) ABSTRACT

A light emitting device includes a substrate, light emitting units, an insulation layer, a current distribution layer and a reflective layer. The substrate has an upper surface. The light emitting units are disposed on the upper surface and include at least one first light emitting diode (LED) and at least one second LED. A first side wall of the first LED is adjacent to a second side wall of the second LED so as to define a concave portion exposing a portion of the upper surface. The insulation layer at least covers the first side wall and the second side wall. The current distribution layer covers the concave portion and at least covers a portion of the second LED. The reflective layer covers the current distribution layer and is electrically connected to the first LED and the second LED.

17 Claims, 5 Drawing Sheets

LIGHT EMITTING DEVICE

CROSS-REFERENCE TO RELATED APPLICATION

This application claims the priority benefit of Taiwan application serial no. 101148146, filed on Dec. 18, 2012. The entirety of the above-mentioned patent application is hereby incorporated by reference herein and made a part of this specification.

BACKGROUND OF THE INVENTION

1. Field of the Invention

The invention relates to a light emitting device, and more particularly, to a light emitting device using a light emitting diode as light source.

2. Description of Related Art

As the technology for light emitting diode (LED) grows, light emitting diodes have gradually taken the place of traditional bulbs in lighting field. Since the conventional light emitting diodes are driven by direct current (DC), the conventional light emitting diodes can only be applied in DC-driven environments. Or, AC-DC converters and voltage transformers are needed for transferring the conventional alternating current (AC) to the lower voltage direct current so as to provide DC to light emitting diodes.

However, the commercially available electricity is usually 110V/220V alternating current. Therefore, there exists an inconvenient trouble of the conventional light emitting diodes by using direct current. Accordingly, some researchers developed alternating current light emitting diode (AC LED) or high voltage light emitting diode (HV LED). For AC LEDs, extra voltage transformers, rectifiers, or driving circuits are not required, and AC LEDs can be driven by applying alternating current directly. For HV LEDs, the transformation for lower voltage direct current is not required, and HV LEDs can be driven by conventional direct current, hereby reducing energy consumption occurred in voltage transformers.

Currently, the AC LED/HV LED both are made for forming light emitting unit matrix and internal connection circuits on a miniature-sized single chip, using the internal connection circuits to connect a plurality of light emitting diode in series or in parallel, such that the AC LED/HV LED may have the ability to adjust voltage and current. Generally, the internal connection circuits usually adopt transparent conductive materials, such as indium tin oxide (ITO). Since the internal connection circuit can only provide the effect of electrical connection, the light emitting efficiency is lower at the bridging portion of two adjacent light emitting diodes.

SUMMARY OF THE INVENTION

The invention provides a light emitting device, which is capable of increasing the light reflection effect at the bridging portion of the two adjacent light emitting diodes, so as to increase the total light emitting efficiency of the light emitting device.

An embodiment of the invention provides a light emitting device, which includes a substrate, light emitting units, an insulation layer, a current distribution layer, and a reflective layer. The substrate has an upper surface. The light emitting units are disposed on the upper surface of the substrate. The light emitting units include at least one first light emitting diode and at least one second light emitting diode. A first side wall of the first light emitting diode and a second side wall of the second light emitting diode are adjacent and define a concave portion, and the concave portion exposes a portion of the upper surface of the substrate. The insulation layer at least covers the first side wall of the first light emitting diode and the second side wall of the second light emitting diode. The current distribution layer covers the concave portion, and at least covers a portion of the second light emitting diode. The reflective layer covers the current distribution layer, and electrically connects to the first light emitting diode and the second light emitting diode.

In an embodiment of the invention, the light emitting device further includes a blocking layer disposed on the reflective layer.

In an embodiment of the invention, a material of the blocking layer includes wolfram, titanium-tungsten or titanium-tungsten/platinum.

In an embodiment of the invention, the insulation layer further covers the portion of the upper surface of the substrate exposed by the concave portion, and the current distribution layer extendedly covers a portion of the first light emitting diode.

In an embodiment of the invention, the current distribution layer does not cover the first light emitting diode.

In an embodiment of the invention, the insulation layer further covers the portion of the upper surface of the substrate exposed by the concave portion.

In an embodiment of the invention, the upper surface of the substrate has a recess, and the recess is disposed corresponding to the concave portion, and the insulation layer further extends to the recess and covers the recess.

In an embodiment of the invention, the upper surface of the substrate has a recess, and the recess is disposed corresponding to the concave portion, and the insulation layer further extends to the recess but does not cover a bottom of the recess, and the current distribution layer further covers the bottom of the recess.

In an embodiment of the invention, the first light emitting diode includes a first semiconductor element layer, a first electrode and a second electrode, and the first semiconductor element layer includes a first semiconductor layer, a first light emitting layer, and a second semiconductor layer. The first light emitting layer is disposed between the first semiconductor layer and the second semiconductor layer. The first electrode is located on the first semiconductor layer, and the second electrode is located on the second semiconductor layer.

In an embodiment of the invention, the insulation layer further covers a portion of the first semiconductor layer, and the current distribution layer further covers a portion of the first electrode.

In an embodiment of the invention, the light emitting device further includes a blocking layer, wherein the blocking layer is disposed on the reflective layer and between the second electrode and the second semiconductor layer of the first light emitting diode.

In an embodiment of the invention, the second light emitting diode includes a second semiconductor element layer and a third electrode, and the second semiconductor element layer includes a third semiconductor layer, a second light emitting layer and a fourth semiconductor layer. The second light emitting layer is disposed between the third semiconductor layer and the fourth semiconductor layer, and the third electrode is located on the third semiconductor layer. The insulation layer further covers a portion of the fourth semiconductor layer. The current distribution layer covers a part of the fourth semiconductor layer, and an ohmic contact is defined by the current distribution layer and the fourth semiconductor layer.

In an embodiment of the invention, the first side wall of the first light emitting diode and the second side wall of the second light emitting diode are respectively a leaning side wall or a perpendicular side wall.

In an embodiment of the invention, a material of the insulation layer includes silicon oxide or titanium oxide.

In an embodiment of the invention, the insulation layer is formed by at least two materials with different refractive indexes.

In an embodiment of the invention, a material of the current distribution layer includes nickel/gold, indium tin oxide, cadmium tin oxide, antimony tin oxide, zinc oxide, or combinations of the above materials.

In an embodiment of the invention, a material of the reflective layer includes silver, titanium, aluminum, gold, chromium, nickel, platinum, or alloys of the above materials.

In an embodiment of the invention, the reflective layer is formed by a plurality of metals or metal alloys with different reflective indexes.

In an embodiment of the invention, the first light emitting diode and the second light emitting diode are electrically connected by series connection or parallel connection.

In an embodiment of the invention, the first light emitting diode and the second light emitting diode may be light emitting diodes in the flip chip type.

Based on the above description, the reflective layer of the invention not only has electrical capability so as to electrically connect the two adjacent light emitting diodes, but also has high reflective efficiency so as to reflect beams emitted from the light emitting layers of the light emitting diodes. Therefore, compared with the conventional HV LED, the light emitting device has better light emitting efficiency.

In order to make the aforementioned and other objectives and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
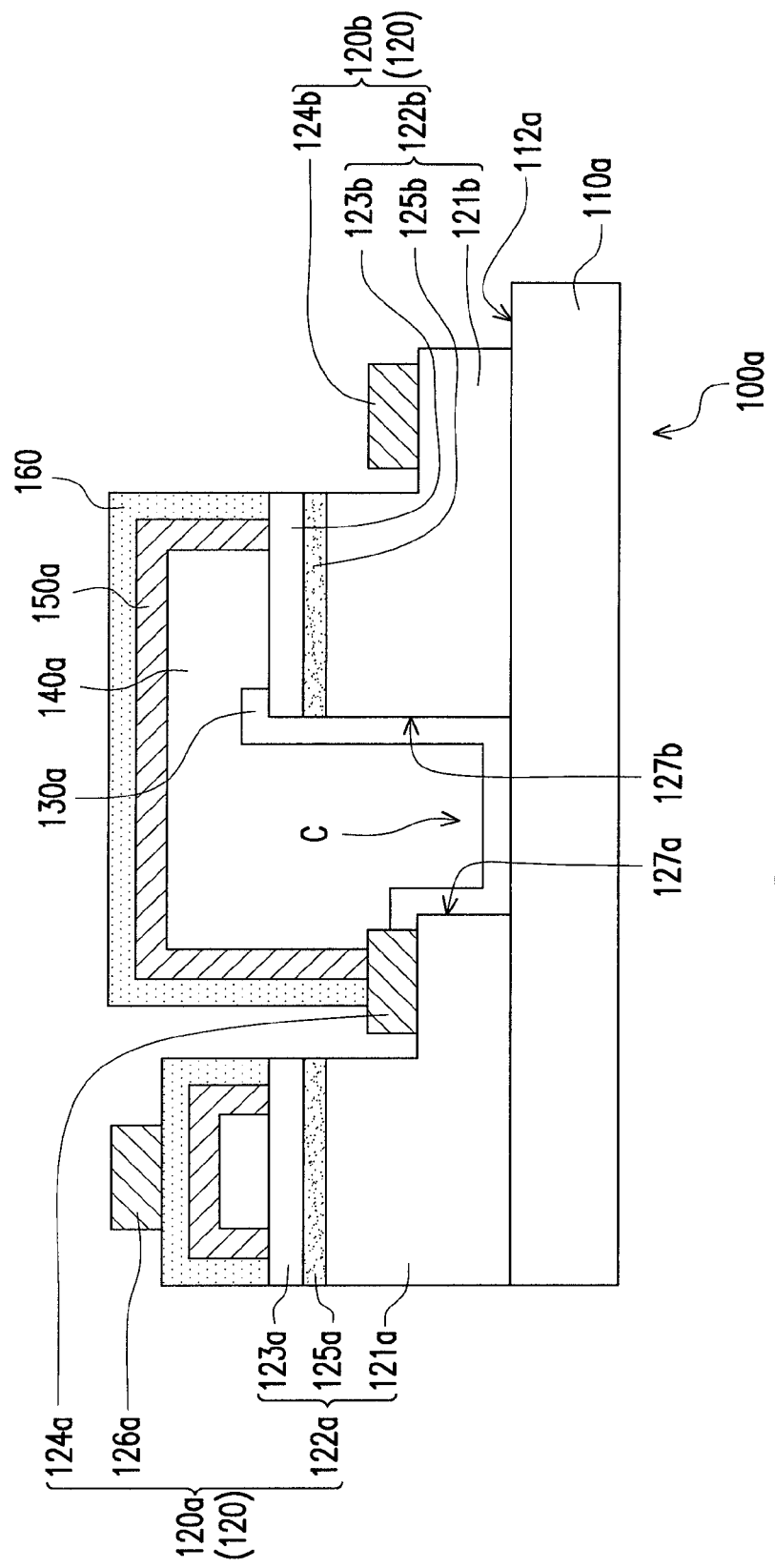
FIG. 1 is a schematic cross-sectional view illustrating a light emitting device according to an embodiment of the present invention.

FIG. 1 is a schematic cross-sectional view illustrating a light emitting device according to an embodiment of the present invention. Referring to FIG. 1, in this embodiment, the light emitting device 100a includes a substrate 110a, light emitting units 120, an insulation layer 130a, a current distribution layer 140a, and a reflective layer 150a. The substrate 110a has an upper surface 112a. The light emitting units 120a are disposed on the upper surface 112a of the substrate 110a. The light emitting units 120 includes at least one first light emitting diode 120a (FIG. 1 schematically illustrates only one) and at least one second light emitting diode 120b (FIG. 1 schematically illustrates only one). A first side wall 127a of the first light emitting diode 120a and a second side wall 127b of the second light emitting diode 120b are adjacent and define a concave portion C, and the concave portion C exposes a portion of the upper surface 112a of the substrate 110a. The insulation layer 130a at least covers the first side wall 127a of the first light emitting diode 120a and the second side wall 127b of the second light emitting diode 120b. The current distribution layer 140a covers the concave portion C, and at least covers a portion of the second light emitting diode 120b. The reflective layer 150a covers the current distribution layer 140a, and electrically connects to the first light emitting diode 120a and the second light emitting diode 120b.

More specifically, in the present embodiment, the first light emitting diode 120a includes a first semiconductor element layer 122a, a first electrode 124a and a second electrode 126a. The first semiconductor element layer 122a of the first light emitting diode 120a consists of a first semiconductor layer 121a, a first light emitting layer 125a, and a second semiconductor layer 123a. The first light emitting layer 125a is disposed between the first semiconductor layer 121a and the second semiconductor layer 123a. The first electrode 124a is located on the first semiconductor layer 121a and the insulation layer 130a further covers a portion of the first semiconductor layer 121a. The second light emitting diode 120b includes a second semiconductor element layer 122b and a third electrode 124b. The second semiconductor element layer 122b of the second light emitting diode 120b consists of a third semiconductor layer 121b, a second light emitting layer 125b, and a fourth semiconductor layer 123b. The second light emitting layer 125b is disposed between the third semiconductor layer 121b and the fourth semiconductor layer 123b. The third electrode 124b is located on the third semiconductor layer 121b. The insulation layer 130a further covers a portion of the fourth semiconductor layer 123b and the portion of the upper surface 112a of the substrate 110a exposed by the concave portion C. Namely, the insulation layer 130a is a continuous layer so as to cover the first side wall 127a, the second side wall 127b and the portion of the upper surface 112a of the substrate 110a exposed by the concave portion C. The current distribution layer 140a covers a portion of the first electrode 124a and the second semiconductor layer 123a and the second semiconductor element layer 122b of the second light emitting diode 120b. Especially, the current distribution layer 140a covers a portion of the fourth semiconductor layer 123b, and an ohmic contact is defined by the current distribution layer 140a and the fourth semiconductor layer 123b. The reflective layer 150a further covers the current distribution layer 140a located on the second semiconductor layer 123a, and the second electrode 126a is located on the reflective layer 150a. Especially, the reflective layer 150a electrically connects to the first electrode 124a of the first light emitting diode 120a and the second semiconductor element layer 122b of the second light emitting diode 120b. Here, the first light emitting diode 120a and the second light emitting diode 120b are respectively in the flip chip type. In the present embodiment, the first side wall 127a of the first light emitting diode 120a and the second side wall 127b of the second light emitting diode 120b are respectively perpendicular walls. Namely, the first side wall 127a and the second side wall 127b are arranged in parallel to each other. Of course, in other embodiments not illustrated, the first side wall 127a of the first light emitting diode 120a and the second side wall 127b of the second light emitting diode 120b may respectively be leaning walls as well and is not limited thereto. Moreover, in the present embodiment, the insulation layer 130a may be a single material layer for instance, wherein a material of the insulation layer 130 may be silicon oxide or titanium oxide for instance. Of course, in other embodiments not illustrated, the insulation layer 130a may be formed by at least two materials with different refractive indexes and is not limited thereto. Besides, in the present embodiment, a material of the current distribution layer 140a may be nickel/gold, indium tin oxide, cadmium tin oxide, antimony tin oxide, zinc oxide, or combinations of the above materials, wherein the current distribution layer 140a has good current distribution ability. Herein, the current distribution layer 140a also has the ability to electrically connect the first electrode 124a of the first light emitting diode 120a and the second semiconductor element layer 122b of the second light emitting diode 120b.

Especially, in the present embodiment, the reflective layer 150a has not only high reflective efficiency, but also electrical capability to electrically connect the first light emitting diode 120a and the second light emitting diode 120b. Namely, in the present embodiment, the first light emitting diode 120a and the second light emitting diode 120b may electrically connect with each other through the reflective layer 150a by series connection or parallel connection. Herein, the reflective layer 150a may be a single metal layer, wherein a material of the reflective layer 150a may be silver, titanium, aluminum, gold, chromium, nickel, platinum, or alloys of the above materials for instance. Of course, in other embodiments not illustrated, the reflective layer 150a may be formed by a plurality of metals or metal alloys with different reflective indexes and is not limited thereto.

Besides, in order to prevent the metal diffusion, so as to further increases the light emitting efficiency of the light emitting device 100a, the light emitting device 100a in the present embodiment may further includes a blocking layer 160, wherein the blocking layer 160 is disposed on the reflective layer 150a. Namely, the blocking layer 160 crossly connects the first electrode 124a of the first light emitting diode 120a and the fourth semiconductor layer 123b of the second light emitting diode 120b, and is disposed between the second electrode 126a of the first light emitting diode 120a and the second semiconductor layer 123a of the first semiconductor element layer 122a. Herein, a material of the blocking layer 160 may be wolfram, titanium-tungsten or titanium-tungsten/platinum for instance, wherein the materials mentioned above adopted by the blocking layer 160 can be diffusion blockings as well as fine reflective metals.

Since the reflective layer 150a of the present embodiment not only has electrical capability, so as to electrically connect the adjacent first light emitting diode 120a and the second light emitting diode 120b, but also has high reflective efficiency and may reflects beams emitted from the first light emitting layer 123a and the second light emitting layer 123b of the first light emitting diode 120a and the second light emitting diode 120b. Therefore, compared with the conventional HV LED adopting transparent conductive materials for internal connection circuits, a better reflective efficiency may be obtained at the bridging portion of the two adjacent first light emitting diode 120a and the second light emitting diode 120b. Accordingly, the light emitting device 100a of the present embodiment may have a better light emitting efficiency. Besides, the blocking layer 160 disposed on the reflective layer 150a not only can be used as a diffusion blocking, but also have fine reflection effect. Therefore, the configuration of the blocking layer 160 also benefits the increasing of total light emitting efficiency of the light emitting device 100a.

It should be illustrated here that the following embodiments follow the element label and parts of the content of the embodiment above, wherein the same label is used to represent the same or similar elements, and the description of the same technical content is omitted. The description of the omitted parts may refer to the embodiment mentioned above, and are not being repeated in the following descriptions.

Figure 2:
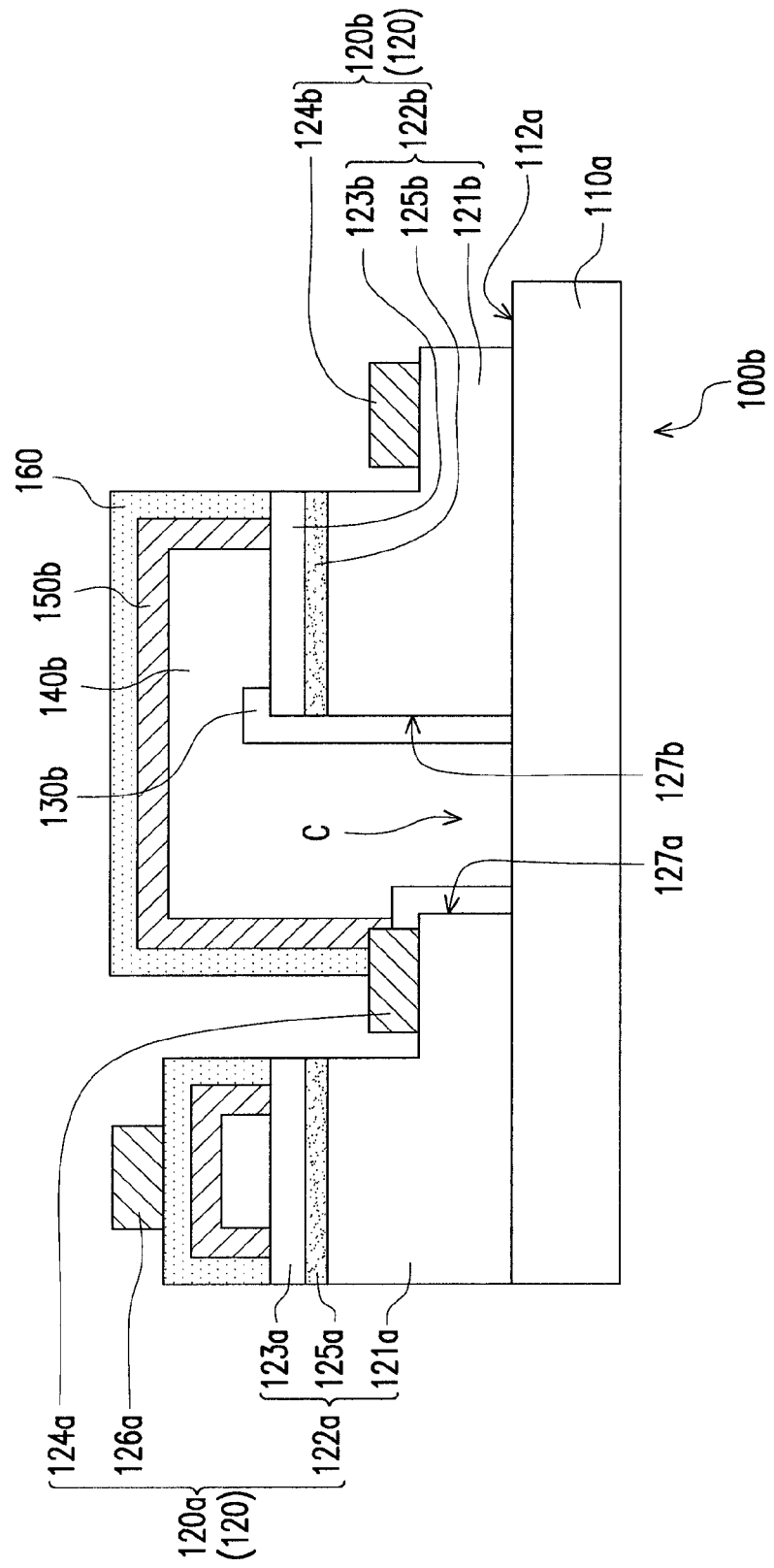
FIG. 2 is a schematic cross-sectional view illustrating a light emitting device according to another embodiment of the present invention.

FIG. 2 is a schematic cross-sectional view illustrating a light emitting device according to another embodiment of the present invention. Referring to FIG. 2, the light emitting device 100b in the present embodiment is similar to the light emitting device 100a illustrated in FIG. 1, while the main difference therebetween lies in that the current distribution layer 140b of the light emitting device 100b in the present embodiment covers the portion of the upper surface 112a of the substrate 110a exposes by the concave portion C, but does not cover the first electrode 124a of the first light emitting diode 120a. Namely, the current distribution layer 140b contacts the reflective layer 150b, the fourth semiconductor layer 123b of the second light emitting diode 120b, the insulation layer 130b, and the portion of the upper surface 112a of the substrate 110a exposes by the concave portion C. Herein, the insulation layer 130b is a discontinuous layer, and only covers the first side wall 127a and the second side wall 127b.

Figure 3:
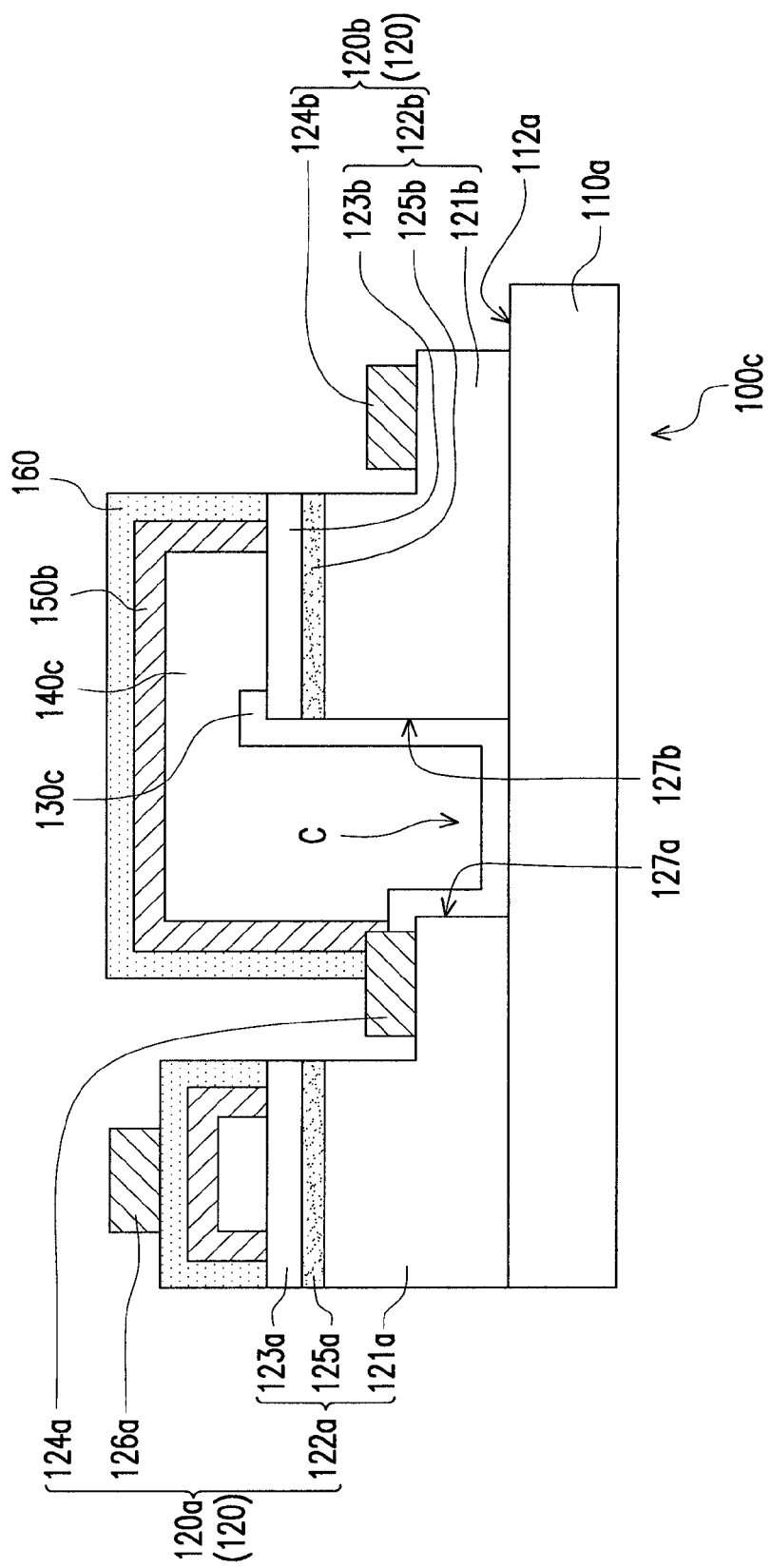
FIG. 3 is a schematic cross-sectional view illustrating a light emitting device according to still another embodiment of the present invention.

FIG. 3 is a schematic cross-sectional view illustrating a light emitting device according to still another embodiment of the present invention. Referring to FIG. 3, the light emitting device 100c in the present embodiment is similar to the light emitting device 100b in FIG. 2, while the main difference therebetween lies in that the insulation layer 130c of the light emitting device 100c further covers the portion of the upper surface 112a of the substrate 110 exposed by the concave portion C. Namely, the insulation layer 130c is a continuous layer so as to cover the first side wall 127a, second side wall 127b, and the portion of the upper surface 112a of the substrate 110a exposed by the concave portion C. The current distribution layer 140c only contacts the reflective layer 150b, the fourth semiconductor layer 123b of the second light emitting diode 120b, and the insulation layer 130c.

Figure 4:
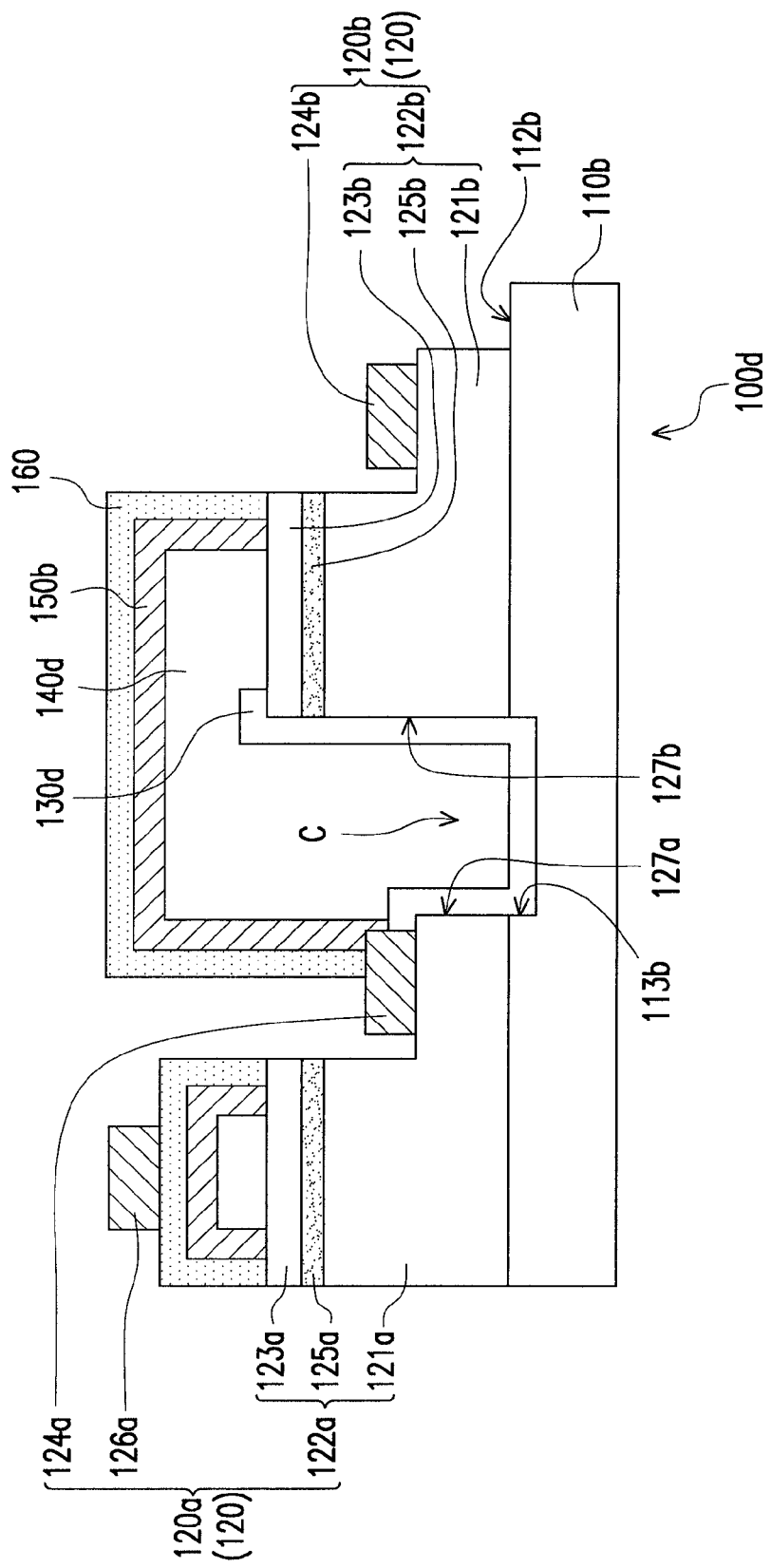
FIG. 4 is a schematic cross-sectional view illustrating a light emitting device according to yet another embodiment of the present invention.

FIG. 4 is a schematic cross-sectional view illustrating a light emitting device according to yet another embodiment of the present invention. Referring to FIG. 4, the light emitting device 100d in the present embodiment is similar to the light emitting device 100b in FIG. 2, while the main difference therebetween lies in that the upper surface 112b of the substrate 110b of the light emitting device 100d in the present embodiment further has a recess 113b, the recess 113b is disposed corresponding to the concave portion C, and the insulation layer 130d further extends to the recess 113b and covers the recess 113b. Namely, the insulation layer 130d is a continuous layer covers the first side wall 127a and the second side wall 127b and extends to the recess 113b and covers the recess 113b. The current distribution layer 140d only contacts the reflective layer 150b, the fourth semiconductor layer 123b of the second light emitting diode 120b, and the insulation layer 130d.

Figure 5:
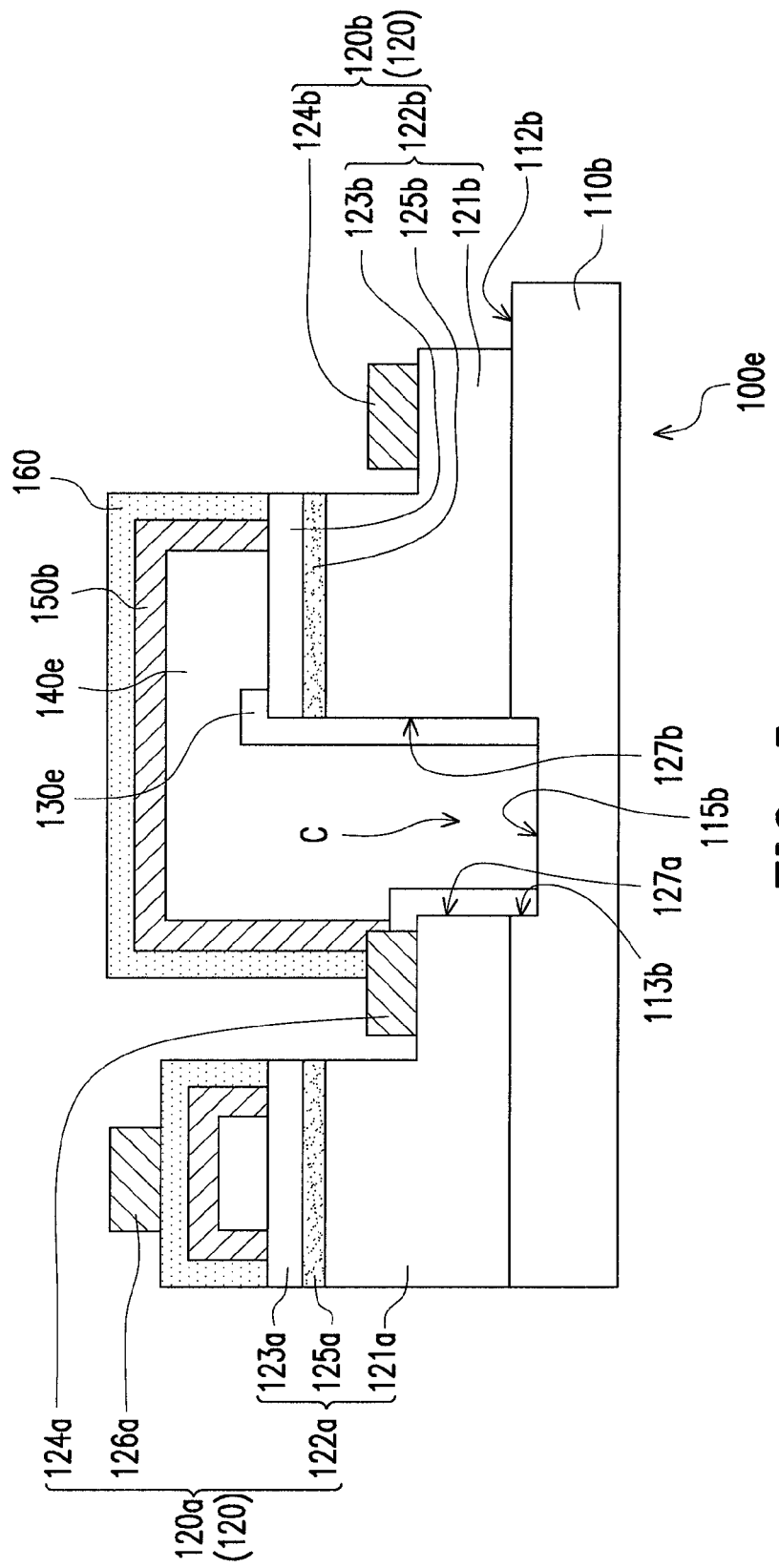
FIG. 5 is a schematic cross-sectional view illustrating a light emitting device according to further another embodiment of the present invention.

FIG. 5 is a schematic cross-sectional view illustrating a light emitting device according to further another embodiment of the present invention. Referring to FIG. 5, the light emitting device 100e in the present embodiment is similar to the light emitting device 100d in FIG. 4, while the main difference therebetween lies in that the insulation layer 130e of the light emitting device 100e in the present embodiment further extends to the recess 113b but does not cover a bottom 115b of the recess 113b. Namely, the insulation layer 130e is a discontinuous layer and only covers the first side wall 127a and the second side wall 127b and extends to the recess 113b. The current distribution layer 140e contacts the reflective layer 150b, the fourth semiconductor layer 123b of the second light emitting diode 120b, the insulation layer 130e, and the bottom 115b of the recess 113b.

It should be described that the invention is not limited to the electrical conduction status of the current distribution layers 140b, 140c, 140d, and 140e of the light emitting devices 100b, 100c, 100d, and 100e. Though the current distribution layer 140b, 140c, 140d, and 140e do not have the ability of electrical connection in the embodiments mentioned here, namely, the first electrode 124a of the first light emitting diode 120a and the second semiconductor element layer 122b of the second light emitting diode 120b are not electrically connected by the current distribution layers 140b, 140c, 140d, and 140e, but by the reflective layer 150b for achieving the effect of electrical conduction. However, in other embodiments not illustrated, the current distribution layer 140a having the ability of electrical conduction as mentioned in above embodiment may also be adopted, and the technical personnel in this field may refers to the description of the above embodiments, according to practical needs, adopting the said configurations, so as to achieve the wanted technical effect.

In summary, the reflective layer of the invention may have not only electrical capability to electrically connects the two adjacent light emitting diodes, but also high reflection efficiency to reflect beams emitted from the light emitting layers of the light emitting diodes. Therefore, compared with the conventional HV LED, the light emitting device of the invention may have better light emitting efficiency.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:
1. A light emitting device comprising:
a substrate having an upper surface;
a plurality of light emitting units disposed on the upper surface of the substrate, the light emitting units comprising:
at least one first light emitting diode, wherein the first light emitting diode comprises a first semiconductor element layer, a first electrode and a second electrode, and the first semiconductor element layer comprises a first semiconductor layer, a first light emitting layer, and a second semiconductor layer, and the first light emitting layer is disposed between the first semiconductor layer and the second semiconductor layer, and the first electrode is located on the first semiconductor layer, and the second electrode is located on the second semiconductor layer; and
at least one second light emitting diode, wherein a first side wall of the first light emitting diode and a second side wall of the second light emitting diode are adjacent and define a concave portion, and the concave portion exposes a portion of the upper surface of the substrate;
an insulation layer at least covering the first side wall of the first light emitting diode and the second side wall of the second light emitting diode;
a current distribution layer covering the concave portion, and at least covering a portion of the second light emitting diode;
a reflective layer covering the current distribution layer, and electrically connected to the first light emitting diode and the second light emitting diode; and
a blocking layer, disposed on the reflective layer and between the second electrode and the second semiconductor layer of the first light emitting diode.

2. The light emitting device as claimed in claim 1, wherein a material of the blocking layer comprises wolfram, titanium-tungsten or titanium-tungsten/platinum.

3. The light emitting device as claimed in claim 1, wherein the insulation layer further covers the portion of the upper surface of the substrate exposed by the concave portion, and the current distribution layer extendedly covers a portion of the first light emitting diode.

4. The light emitting device as claimed in claim 1, wherein the current distribution layer does not cover the first light emitting diode.

5. The light emitting device as claimed in claim 4, wherein the insulation layer further covers the portion of the upper surface of the substrate exposed by the concave portion.

6. The light emitting device as claimed in claim 1, wherein the upper surface of the substrate has a recess, and the recess is disposed corresponding to the concave portion, and the insulation layer further extends to the recess and covers the recess.

7. The light emitting device as claimed in claim 1, wherein the upper surface of the substrate has a recess, and the recess is disposed corresponding to the concave portion, and the insulation layer further extends to the recess and is a discontinuous layer that covers the first side wall and the second side wall, and the current distribution layer further covers the bottom of the recess.

8. The light emitting device as claimed in claim 1, wherein the insulation layer further covers a portion of the first semiconductor layer, and the current distribution layer further covers a portion of the first electrode.

9. The light emitting device as claimed in claim 1, wherein the second light emitting diode comprises a second semiconductor element layer and a third electrode, the second semiconductor element layer comprises a third semiconductor layer, and a second light emitting layer and a fourth semiconductor layer, and the second light emitting layer is disposed between the third semiconductor layer and the fourth semiconductor layer, and the third electrode is located on the third semiconductor layer, and the insulation layer further covers a portion of the fourth semiconductor layer, and the current distribution layer covers a portion of the fourth semiconductor layer, and an ohmic contact is defined by the current distribution layer and the fourth semiconductor layer.

10. The light emitting device as claimed in claim 1, wherein the first side wall of the first light emitting diode and the second side wall of the second light emitting diode are respectively a leaning side wall or a perpendicular side wall.

11. The light emitting device as claimed in claim 1, wherein a material of the insulation layer comprises silicon oxide or titanium oxide.

12. The light emitting device as claimed in claim 1, wherein the insulation layer is formed by at least two materials with different refractive indexes.

13. The light emitting device as claimed in claim 1, wherein a material of the current distribution layer comprises nickel/gold, indium tin oxide, cadmium tin oxide, antimony tin oxide, zinc oxide, or combinations of the above materials.

14. The light emitting device as claimed in claim 1, wherein a material of the reflective layer comprises silver, titanium, aluminum, gold, chromium, nickel, platinum, or alloys of the above materials.

15. The light emitting device as claimed in claim 1, wherein the reflective layer is formed by a plurality of metals or metal alloys with different reflective indexes.

16. The light emitting device as claimed in claim 1, wherein the first light emitting diode and the second light emitting diode are electrically connected by series connection or parallel connection.

17. The light emitting device as claimed in claim 1, wherein the first light emitting diode and the second light emitting diode are light emitting diodes in the flip chip type.

* * * * *